United States Patent
Harwood

(10) Patent No.: US 8,244,490 B2
(45) Date of Patent: *Aug. 14, 2012

(54) POWER TRIGGER WITH TIME QUALIFIED AND SEQUENTIAL EVENT CAPABILITY

(75) Inventor: Steven L. Harwood, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 424 days.

This patent is subject to a terminal disclaimer.

(21) Appl. No.: 12/369,669

(22) Filed: Feb. 11, 2009

(65) Prior Publication Data
US 2010/0204937 A1    Aug. 12, 2010

(51) Int. Cl.
*G01R 13/00* (2006.01)
*G01R 23/16* (2006.01)

(52) U.S. Cl. ............... 702/66; 702/76; 702/124

(58) Field of Classification Search .......... 702/76, 702/77, 79, 81, 111, 118, 120, 121, 122, 702/124, 126, 176, 183, 193, 66; 324/76.22, 324/312; 327/58; 340/539.26; 342/70; 345/158
See application file for complete search history.

(56) References Cited

U.S. PATENT DOCUMENTS

| | | | |
|---|---|---|---|
| 4,870,348 A | 9/1989 | Smith et al. | |
| 5,103,402 A | 4/1992 | Morton et al. | |
| 5,381,150 A | 1/1995 | Hawkins et al. | |
| 7,251,577 B2 * | 7/2007 | Bernard et al. | 702/124 |
| 2006/0015277 A1 | 1/2006 | Bernard et al. | |
| 2006/0025947 A1 | 2/2006 | Earls | |
| 2007/0174021 A1 | 7/2007 | Bernard et al. | |
| 2007/0282542 A1 | 12/2007 | Duff et al. | |
| 2010/0204939 A1* | 8/2010 | Hillman et al. | 702/76 |

OTHER PUBLICATIONS

U.S. Appl. No. 12/369,660, filed Feb. 11, 2009, "Amplitude Discrimination Using The Frequency Mask Trigger", Inventors: Alfred K. Hillman, Jr., et al., Assignee: Tektronix, Inc.
U.S. Appl. No. 12/369,673, filed Feb. 11, 2009, Time Qualified Frequency Mask Trigger, Inventors: Alfred K. Hillman, Jr., et al., Assignee: Tektronix, Inc.
Non-Final Rejection in U.S. Appl. No. 12/369,660 dated Jun. 22, 2011.
Non-Final Rejection in U.S. Appl. No. 12/369,673 dated Jun. 24, 2011.
Anonymous: "Fundamentals of Real-Time Spectrum Analysis", 2008, pp. 1-52, XP002668787, Retrieved from the Internet: URL: http://www.tektronix-resources.com/0803pulsedrf/fundamentals spectrumanalysis.pdf—[retrieved on Feb. 1, 2012].
Notice of Allowance in U.S. Appl. No. 12/369,660 dated Feb. 15, 2012.

* cited by examiner

*Primary Examiner* — John H Le
(74) *Attorney, Agent, or Firm* — Michael A. Nelson

(57) ABSTRACT

A power trigger is provided having time qualified and sequential event capability. Digital data representing an input signal is converted into a power signal. The power signal is compared to a trigger level. A trigger signal is generated when the power signal violates the trigger level for either at least or less than a specified time duration. Alternatively, the trigger signal may be generated on the occurrence of a sequence of such violations.

12 Claims, 2 Drawing Sheets

POWER TRIGGER WITH TIME QUALIFIED AND SEQUENTIAL EVENT CAPABILITY

FIELD OF THE INVENTION

The present invention relates to test and measurement instruments, and more particularly to triggers for use in the frequency domain.

BACKGROUND OF THE INVENTION

Real-time spectrum analyzers such as the RSA6100 and RSA3400 families available from Tektronix, Inc. of Beaverton, Oreg. trigger on, capture, and analyze RF signals in real-time. These instruments capture seamless blocks of data so that, unlike conventional frequency swept spectrum analyzers, no data is missed or lost.

These instruments have what is known as a power trigger or intermediate frequency (IF) level trigger. The power trigger calculates the power of real-time data provided by the instrument's receiver system and then compares it to a trigger level. When the power violates the trigger level, a trigger signal is generated which causes a seamless block of data representing the received RF signal to be stored containing the triggering event as well what happened immediately before and immediately after the triggering event.

SUMMARY OF THE INVENTION

In some instances a user may want to trigger on signals having a specified pulse width. For example, when observing pulsed or bursted RF signal traffic with a nominal pulse width of 1 ms, the user may want to trigger on errant RF pulses which have pulse widths of less than 1 ms or greater than 1 ms. The conventional power trigger cannot detect such errant pulses because it has no capability to trigger on signals which violate the trigger level for a specified time duration; the conventional power trigger simply generates the trigger signal as soon as the power violates the trigger level, regardless of how long the violation occurs.

In other instances a user may want to trigger on a pulse signal whose power passes through a lower power threshold but then fails to reach a higher power threshold before returning to the lower power threshold. The conventional power trigger cannot detect such a condition because it only has one trigger level; the conventional power trigger has no capability to trigger on a signal which violates a sequence of trigger levels.

What is desired is a power trigger capable of triggering on time qualified and sequential events.

Accordingly, embodiments of the present invention provide a power trigger having time qualified and sequential event capability. Digital data representing an input signal is converted into a power signal. The power signal is compared to a trigger level. A time qualified trigger signal is generated when the power signal violates the trigger level for either at least or less than a specified time duration. Alternatively, the trigger signal may be generated on the occurrence of a sequence of such violations.

The objects, advantages and other novel features of the present invention are apparent from the following detailed description when read in conjunction with the appended claims and attached drawings.

DETAILED DESCRIPTION OF THE INVENTION

Figure 1:
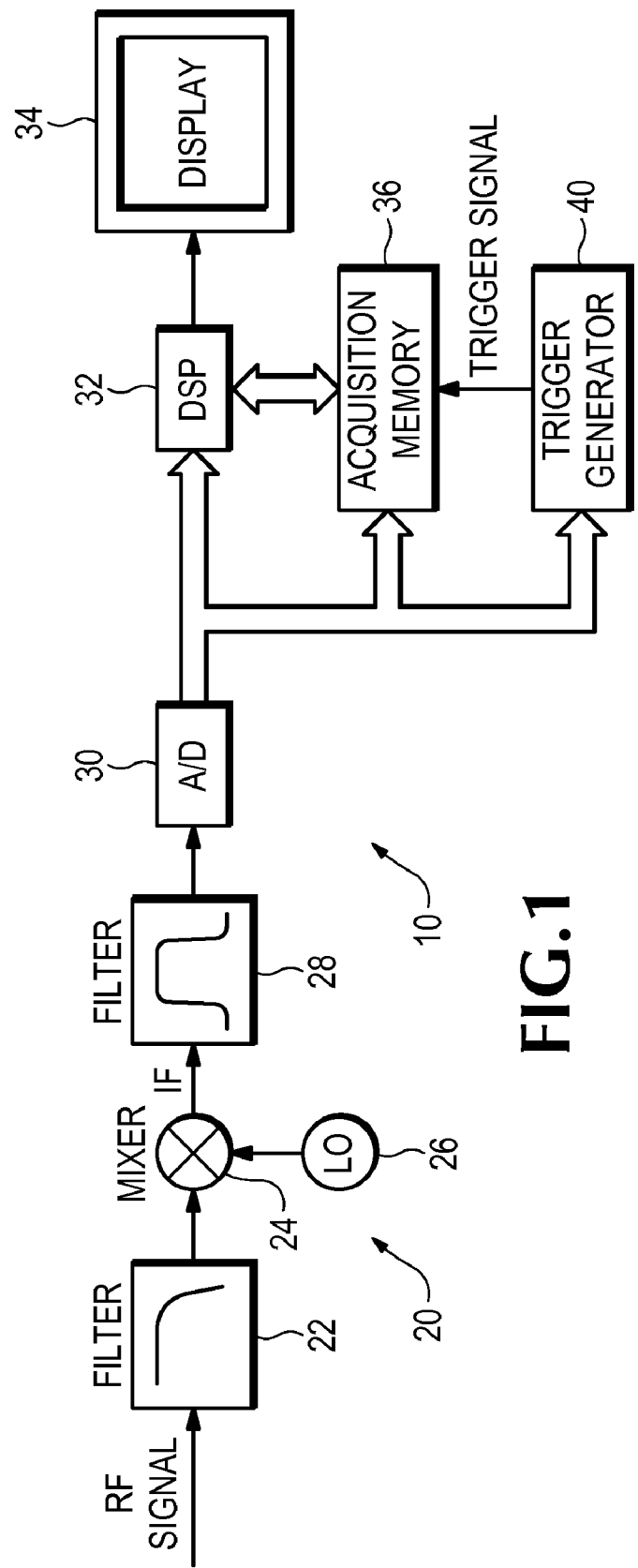
FIG. 1 illustrates a simplified, high-level block diagram of a real-time spectrum analyzer.

Referring now to FIG. 1, a real-time spectrum analyzer 10 is shown having an input processor 20 for receiving a radio frequency (RF) input signal. The input processor 20 includes an optional image reject filter 22 followed by a mixer 24 that converts the filtered input signal to an intermediate frequency (IF) signal using a local oscillator (LO) 26. The image reject filter 22 may be implemented using a lowpass filter, a bandpass filter, or a highpass filter. The IF signal is passed through a bandpass filter 28 and then sampled by an analog-to-digital (A/D) converter 30 to provide a digital signal for further processing. The digital signal is input to a digital signal processor (DSP) 32 for real-time processing for display on a monitor 34, such as in the form of a spectrogram as described in U.S. Pat. No. 4,870,348. The digital signal also is input to an acquisition memory 36 and to a trigger generator 40. In some embodiments, the acquisition memory 36 may be implemented using a circular memory. When the trigger generator 40 detects a trigger event, a trigger signal is generated that causes the acquisition memory 36 to store a seamless block of digital data from the digital signal for subsequent processing by the DSP 32 or for offloading to another processor (not shown) for non-real-time post-processing.

Figure 2:
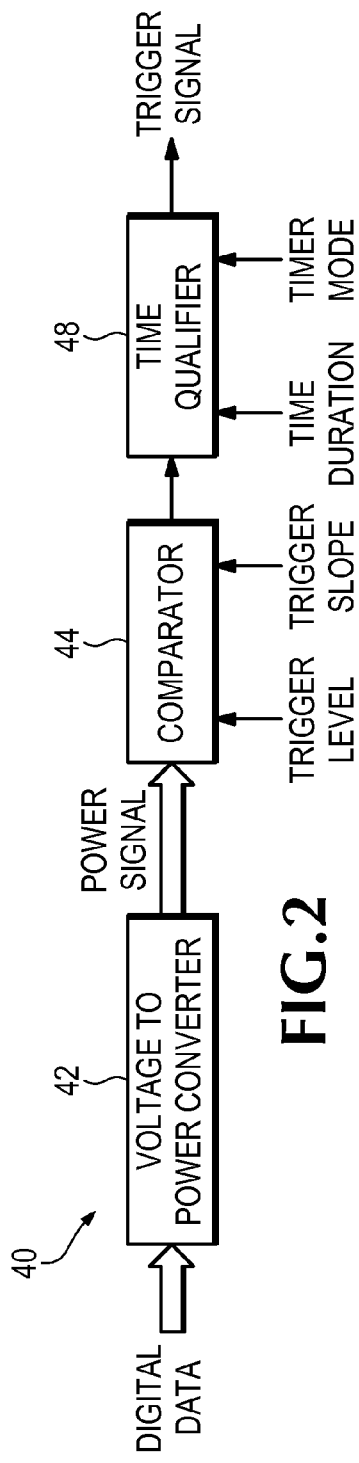
FIG. 2 illustrates a simplified, high-level block diagram of a trigger generator according to a first embodiment of the present invention.

Referring now to FIG. 2, a trigger generator 40 according to an embodiment of the present invention is shown having a voltage-to-power converter 42 for converting the digital signal into a power signal. The power signal is input to a comparator 44 for comparison with a trigger level. When the power signal violates the trigger level, comparator 44 generates an output signal indicating the occurrence of a "trigger event." "Violate" means that the power signal is either greater than or less than the trigger level depending on whether the user defines a trigger slope as "positive" or "negative." Time qualifier 48 measures the duration of the trigger event and generates the trigger signal on the occurrence of a "time qualified trigger event." A time qualified trigger event is a trigger event which is, depending on a specified timer mode, present for either at least or less than a specified time duration. The specified time duration may be set to zero. The minimum time resolution for the specified time duration is one sample because the signal power is computed on a per-sample basis.

In one embodiment of the present invention, time qualifier 48 operates according to the following logic:

If the user specifies that the trigger signal is to be generated when the trigger event has been present for at least the specified time duration, then for each sample,
  a) When the output of the comparator is TRUE, start a timer.
  b) If the output of the comparator is FALSE, reset the timer to zero.
  c) If the timer value exceeds the specified time duration, produce the trigger signal.

If the user specifies that the trigger signal is to be generated when the trigger event has been present for less than the specified time duration, then for each sample,
  a) When the output of the comparator is TRUE, start the timer.

b) If the output of the comparator is FALSE and the timer is greater than zero but less than the specified time duration, produce the trigger signal.

Figure 3:
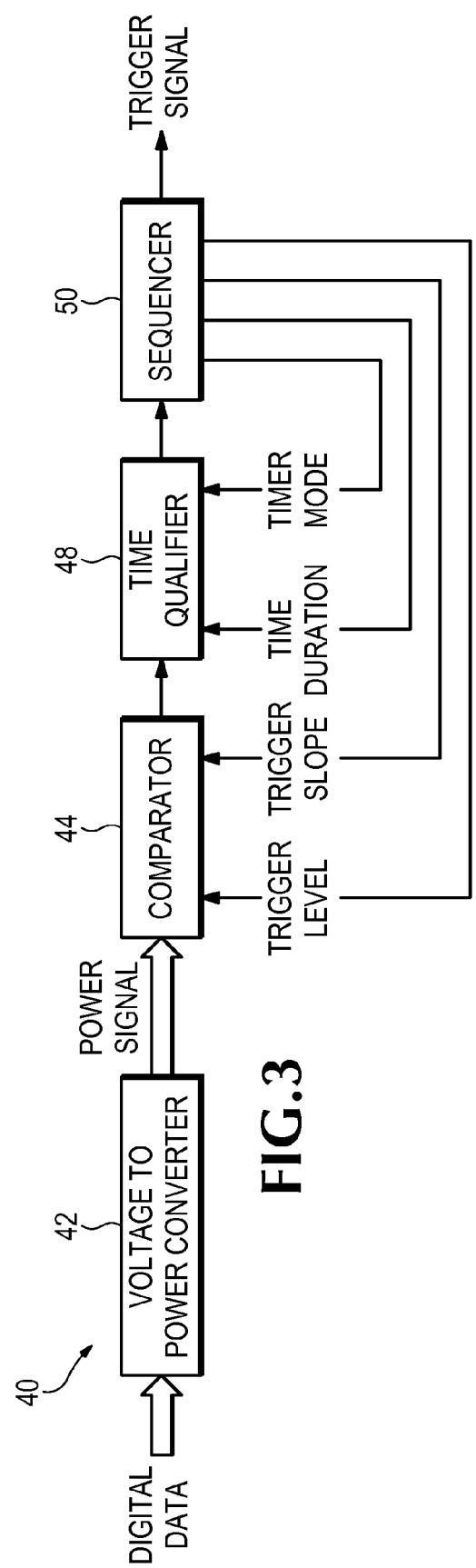
FIG. 3 illustrates a simplified, high-level block diagram of a trigger generator according to a second embodiment of the present invention.

In an alternative embodiment of the present invention shown in FIG. 3, sequencer 50 receives the output of time qualifier 48 and generates the trigger signal on the occurrence of a sequence of time-qualified trigger events. For each time-qualified trigger event, sequencer 50 may sequentially or conditionally apply an associated trigger level, trigger slope, time duration, and timer mode. In this manner, the user may trigger on any mix of trigger levels, trigger slopes, time durations, and timer modes. For example, sequencer 50 may detect a trigger event which is present for a specified time range, that is, present for at least a first time duration but no more than a second time duration, by triggering when the trigger event is present for at least the first time duration and subsequently present for less than the difference between the second time duration and the first time duration. The associated trigger levels, trigger slopes, time durations, and timer modes may be stored in a memory (not shown).

Time qualifier 48 and sequencer 50 may be realized as finite state machines in electronic hardware or software.

In various embodiments, the trigger level, trigger slope, time duration, and timer mode may be specified by the user or by a standard.

In order to provide real-time triggering, the trigger generation processing must be fast enough to keep up with the digital signal stream.

Although embodiments of the present invention have application to spectrum analyzers in particular, any test and measurement instrument which acquires data in response to a trigger signal may use the power trigger having time qualified and sequential event capability.

It will be appreciated from the foregoing that the present invention represents a significant advance in the field of frequency domain triggering. Although a specific embodiment of the invention has been illustrated and described for purposes of illustration, it will be understood that various modifications may be made without departing from the spirit and scope of the invention. It will also be understood that although the embodiments above are described in terms of a real-time spectrum analyzer, the present invention applies equally well to a swept spectrum analyzer, in which case the trigger signal starts or stops a frequency sweep. Accordingly, the invention should not be limited except as by the appended claims.

What is claimed is:

1. An instrument comprising:
   an input processor for receiving an input signal and producing a digital signal;
   a trigger signal generator for generating a trigger signal; and
   an acquisition memory for storing a seamless block of digital data from the digital signal in response to the trigger signal;
   the trigger signal generator comprising:
   a voltage-to-power converter for converting the digital signal into a power signal;
   a comparator for detecting a trigger event, a trigger event being the condition in which the power signal violates a trigger level; and
   a time qualifier for measuring the duration of the trigger event with a timer and generating the trigger signal on the occurrence of a time qualified trigger event.

2. The instrument as recited in claim 1 wherein the time qualified trigger event comprises a trigger event which is present for at least a specified time duration.

3. The instrument as recited in claim 1 wherein the time qualified trigger event comprises a trigger event which is present for less than a specified time duration.

4. The instrument as recited in claim 2 or 3 further comprising a sequencer for generating the trigger signal on the occurrence of a sequence of time qualified trigger events, with each time qualified trigger event having an associated trigger level and time duration.

5. The instrument as recited in claim 1 wherein the input processor comprises:
   a mixer for mixing the input signal with a local oscillator signal to produce an intermediate frequency signal;
   a bandpass filter for filtering the intermediate frequency signal to produce a filtered intermediate frequency signal; and
   an analog-to-digital converter for digitizing the filtered intermediate frequency signal to produce the digital signal.

6. The instrument as recited in claim 5 wherein the input processor further comprises an image reject filter for filtering the input signal.

7. A method of acquiring data within a test and measurement instrument comprising the steps of:
   receiving an input signal and producing a digital signal;
   generating a trigger signal; and
   storing a seamless block of digital data from the digital signal in response to the trigger signal;
   the generating step comprising the steps of:
   converting the digital signal into a power signal;
   detecting a trigger event, a trigger event being the condition in which the power signal violates a trigger level;
   measuring the duration of the trigger event with a timer; and
   producing the trigger signal on the occurrence of a time qualified trigger event.

8. The method as recited in claim 7 wherein the time qualified trigger event comprises a trigger event which is present for at least a specified time duration.

9. The method as recited in claim 7 wherein the time qualified trigger event comprises a trigger event which is present for less than a specified time duration.

10. The method as recited in claim 8 or 9 further comprising the step of producing the trigger signal on the occurrence of a sequence of time qualified trigger events, with each time qualified trigger event having an associated trigger level and time duration.

11. The method as recited in claim 7 wherein the receiving step comprises:
   mixing the input signal with a local oscillator signal to produce an intermediate frequency signal;
   bandpass filtering the intermediate frequency signal to produce a filtered intermediate frequency signal; and
   digitizing the filtered intermediate frequency signal to produce the digital signal.

12. The method as recited in claim 11 wherein the receiving step further comprises the step of filtering the input signal with an image reject filter.

* * * * *